United States Patent
Kersten et al.

(10) Patent No.: US 6,272,745 B1
(45) Date of Patent: *Aug. 14, 2001

(54) METHODS FOR THE PRODUCTION OF PRINTED CIRCUIT BOARDS WITH THROUGH-PLATINGS

(75) Inventors: Peter Kersten, Maulburg; Jörg Kiefer, Zell im Wiesental, both of (DE)

(73) Assignee: Photo Print Electronics GmbH, Schopfheim (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/042,264

(22) Filed: Mar. 13, 1998

Related U.S. Application Data
(60) Provisional application No. 60/043,480, filed on Apr. 11, 1997.

(30) Foreign Application Priority Data

Mar. 14, 1997 (EP) .................................. 97104365

(51) Int. Cl.[7] ....................................... H01K 3/10
(52) U.S. Cl. ................. 29/852; 29/846; 29/832; 29/837; 174/262; 174/264
(58) Field of Search .............................. 29/852, 847, 832, 29/840, 837, 846; 428/209, 901, 408; 174/262, 264

(56) References Cited

U.S. PATENT DOCUMENTS

| | | |
|---|---|---|
| 3,163,588 | 12/1964 | Shortt et al. . |
| 3,436,819 * | 4/1969 | Lunine ................................. 29/852 |
| 4,383,363 | 5/1983 | Hayakawa et al. . |
| 4,964,948 * | 10/1990 | Reed .................................. 156/659.1 |
| 5,153,987 * | 10/1992 | Takahashi et al. ...................... 29/852 |

(List continued on next page.)

FOREIGN PATENT DOCUMENTS

| | | |
|---|---|---|
| 11799-76 | 9/1976 | (AU) . |
| 2 307 438 | 4/1976 | (FR) . |

OTHER PUBLICATIONS

McDermott, C.J., Face Protection of Printed Circuit Boards, 12/68, IBM Technical Disclosure Bulletin, vol. 11, No. 7.

(List continued on next page.)

*Primary Examiner*—Lee Young
*Assistant Examiner*—Minh Trinh
(74) *Attorney, Agent, or Firm*—Bose McKinney & Evans LLP

(57) ABSTRACT

Methods for the production of printed circuit boards (1) with at least one electrically conductive through-plating which runs in a hole (5) in an insulating base material (2) from a first to a second surface include the following steps. The base material is pressed on its surfaces with two-layered foils (3, 4) consisting of a Cu foil (31, 32) covered with a Cu layer (32', 42'), an acrylonitrile-butadiene-styrene-copolymer film (32", 42") or a self-adhesive plastic film (32*, 42*) in such a way that the Cu foils adhere well to the base material. The holes are produced and they as well as the exposed surfaces of the layers (32', 42'; 32", 42"; 32*, 42*) are provided with a further Cu layer (6, 6'). The metallized holes are completely filled with an insulating material (7) or with a conductive material (7'; 8) by spreading on with a squeegee or by rolling on to the exposed surface of the Cu layer (6, 6'). The layers (32', 42'; 32", 42"; 32*, 42*) are removed together with the Cu layer (6, 6'). Stubs (71, 72; 81, 82) which project beyond the remaining Cu foils (31, 41) are removed after the curing of the material (7, 7'; 8) thereby planarizing the Cu foils (31, 41) being now ready for structuring to produce a conductive pattern.

40 Claims, 3 Drawing Sheets

U.S. PATENT DOCUMENTS

| | | | |
|---|---|---|---|
| 5,263,248 | * | 11/1993 | Kiyota et al. .......................... 29/846 |
| 5,277,787 | | 1/1994 | Otani et al. . |
| 5,346,750 | * | 9/1994 | Katakeyama et al. ............... 428/209 |
| 5,487,218 | | 1/1996 | Bhatt et al. . |
| 5,637,834 | * | 6/1997 | La bate, Jr. et al. ................ 174/264 |
| 5,638,598 | * | 6/1997 | Nakaso et al. .......................... 29/852 |
| 5,754,398 | * | 5/1998 | Glovatsky et al. .................. 361/690 |
| 5,822,856 | * | 10/1998 | Bhatt et al. ............................. 29/832 |
| 5,950,306 | * | 9/1999 | Suzuki et al. .......................... 29/852 |
| 6,039,896 | * | 3/2000 | Miyamoto et al. .................. 252/511 |

OTHER PUBLICATIONS

English Language Abstract of Japanese Reference JP 05 129 781, May 25, 1993, "Manufacture of Multilayer Circuit Board".

English Language Abstract of Japanese Reference JP 01 037 079, Feb. 7, 1989, "Manufacture of Through–Hole Printed Wiring Board".

* cited by examiner

METHODS FOR THE PRODUCTION OF PRINTED CIRCUIT BOARDS WITH THROUGH-PLATINGS

This application claims benefit of provisional application No. 60/043,480 Apr. 11, 1997.

FIELD OF THE INVENTION

The invention relates to methods for the production of printed circuit boards with at least one electrically conductive through-plating which runs in a hole in an insulating base material from a first surface to a second surface.

BACKGROUND OF THE INVENTION

Such a through-plating of a printed circuit board serves, for example, to establish an electrically conductive connection between a conductive track running on the first surface and a conductive track running on the second surface, thereby enabling electronic components to be fixed to both surfaces, which electronic components can be interconnected with one another in accordance with a circuit to be realized.

Through-platings are normally holes which are made in the printed circuit board at points which are pre-determined by the layout of the circuit to be realized, the inner sides of said holes being metallized.

As long as only components having connecting wires or legs (resistors, capacitors, coils, transformers, diodes, transistors, integrated circuits, etc.) were intended to be fixed to the printed circuit boards, it was possible to insert the connecting wires or legs directly into the metalized holes and solder them therein. Today's components, however, are almost exclusively SMD components. (The acronym SMD is formed from surface mounted device).

In contrast to components having connecting wires or legs, SMD components only have connecting pads. The latter are soldered in a planar manner on to conductive tracks of printed circuit boards. The holes which are not closed off by the metallization, in other words are open, are not closed off by this soldering and remain open.

If multilayer printed circuit boards with through-platings which pass only through some of the layers and are covered over by outer layers are to be produced, the air remaining in the open holes as a result of the latter being covered over would expand in the event of a temperature increase and might give rise to internal cracks.

SUMMARY OF THE INVENTION

It is therefore essential to close off the metallized holes. If this is done by means of screen printing, in which, as is known, a pasty material or material of similar consistency is forced through a stencil by a squeegee, materials available for this shrink on curing and a cavity forms on the material remaining in a hole. This cavity is likewise highly disruptive for the reasons mentioned in the context of covering over unfilled holes.

In order to solve the problems outlined, a first variant of the invention consists in a method for the production of printed circuit boards with at least one electrically conductive through-plating which runs in a hole in an insulating base material from a first surface to a second surface, having the following steps:

the base material is
either pressed on the first and/or the second surface with a first and/or with a second two-layered foil consisting of a Cu foil covered with a Cu layer, in such a way that the Cu foils adhere well to the base material,
or pressed with a first and/or with a second Cu foil, and a first and/or a second Cu layer is subsequently applied thereto,
the holes are produced,
these holes and the exposed surface of the first and/or of the second Cu layer are provided with a third Cu layer,
the metallized holes are completely filled with an insulating material or with a conductive material by spreading on with the a squeegee or by rolling on to the exposed surface of the third Cu layer,
the first and the second Cu layer are removed together with the third Cu layer,
portions of the insulating material or of the conductive material which project beyond the remaining Cu foils are removed after the curing of said material and, consequently, the surfaces of the Cu foils are planarized, and
the Cu foils are structured in a customary manner to produce a conductive pattern.

According to a preferred embodiment of the first variant of the invention the insulating material or the conductive material is cured already before the first, second and third Cu layer are removed.

Published Australian Patent Application AU-A 11 799/76 describes a method for the production of printed circuit boards with at least one electrically conductive through-plating which runs in a hole in an insulating base material from a first surface to a second surface, having the following steps:

the base material is a thin-film Cu laminate which has been covered by a first and a second Cu foil, respectively,
the holes are produced,
respective walls of the holes are covered by a first Cu layer and the exposed surface of the first and of the second Cu layer are provided with a second and a third Cu layer, respectively,
the first and the second Cu layer together with the second and the third Cu layer are removed by peeling, and
the first Cu layers in the holes are thickened using masks.

In this method, the holes are not filled, but are open after the Cu foils together with the Cu layers has been removed by peeling. As experiments showed this peeling results in irregular edges of the holes. But these irregular edges are unwanted.

U.S. Pat. No. 3,163,588 describes a similar method for the production of printed circuit boards with at least one electrically conductive through-plating which runs in a hole in an insulating base material from a first surface to a second surface, having the following steps:

on the first and the second surface, the base material is covered with a first and a second Cu foil, respectively,
these Cu foils are covered with a first and a second plastic film, respectively,
the holes are produced which runs in the base material, the Cu foils and the plastic films, so that a respective wall of the holes consists of a first portion covering the base material, a second and third portion covering the first and second Cu foil, respectively, and a fourth and fifth portion covering the first and second plastic film, respectively,
the walls of the holes and adjacent portions on the surfaces of the plastic films are metallized by plating, the plastic films together with adjacent portions and the fourth and fifth portions of the walls are removed, and the Cu foils are structured to produce a conductive pattern.

In this method, the holes are not filled, too, but are open after the Cu foils together with the Cu layers and the plastic films has been removed by peeling. As experiments showed again this peeling results in irregular edges of the holes. But these irregular edges are unwanted and are plated once again by a further metallizing step.

In order to solve the problems outlined, a second variant of the invention consists in a method for the production of printed circuit boards with at least one electrically conductive through-plating which runs in a hole in an insulating base material from a first surface to a second surface, having the following steps:

the base material is
either pressed on the first and/or the second surface with a first and/or with a second two-layered foil consisting of a Cu foil covered with a metallizable acrylonitrile-butadiene-styrene-copolymer film, in such a way that the Cu foils adhere well to the base material, or pressed with a first and/or with a second Cu foil, and a first and/or a second metallizable acrylonitrile-butadiene-styrene-copolymer film is subsequently applied thereto, the holes are produced, these holes and the exposed surface of the first and/ or of the second acrylonitrile-butadiene-styrene-copolymer film are provided with a first Cu layer, the metallized holes are completely filled with an insulating material or with a conductive material by spreading on with the a squeegee or by rolling on to the exposed surface of the first Cu layer, the first and the second acrylonitrile-butadiene-styrene-copolymer film are removed together with the first Cu layer, portions of the insulating material or of the conductive material which project beyond the remaining Cu foils are removed after the curing of said material and, consequently, the surfaces of the Cu foils are planarized, and the Cu foils are structured in a customary manner to produce a conductive pattern.

According to a preferred embodiment of the second variant of the invention the insulating material or the conductive material is cured before the first and second acrylonitrile-butadiene-styrene-copolymer film and the first Cu layer are removed.

"IBM Technical Disclosure Bulletin", December 1968, page 733 describes a method for the production of printed circuit boards with at least one electrically conductive through-plating which runs in a hole in an insulating base material from a first surface to a second surface, having the following steps:

the base material has been covered with a first and a second Cu foil by is a on the first and the second surface, respectively, thereon a first and a second plastic film is deposited, respectively, the holes are produced which runs in the base material, the Cu foils and the plastic films, so that a respective wall of the holes consists of a first portion covering the base material, a second and third portion covering the first and second Cu foil, respectively, and a fourth and fifth portion covering the first and second plastic film, respectively, only the walls of the holes are metallized by plating, the metalized holes are completely filled with an insulating material in such a way that the insulating material covers adjacent portions of the exposed surface of the first and second plastic film, respectively, and builds mushroom heads, the insulating material is cured, the plastic films together with the mushroom heads are removed so that the fourth and fifth portion of the wall as copper burrs and portions of the insulating material filling them as resin stubs remain, the copper burrs and the resin stubs are removed and, consequently, the surfaces of the Cu foils are planarized, and, consequently, the surfaces of the Cu foils are planarized, and the Cu foils are structured to produce a conductive pattern.

In the technique of manufacturing printed circuit boards, protruding portions as, for example copper burrs and resin stubs are removed by brushing. If copper burrs and resin stubs are to be removed commonly as it is necessary during the method according to "IBM Technical Disclosure Bulletin", it is difficult because materials extremely different with respect not only to its chemical compositions but also to its mechanical processing are to be removed.

In order to solve the problems outlined, a third variant of the invention consists in a method for the production of printed circuit boards with at least one electrically conductive through-plating which runs in a hole in an insulating base material from a first surface to a second surface, having the following steps:

the base material is
either pressed on the first and/or the second surface with a first and/or with a second two-layered foil consisting of a Cu foil covered with a self-adhesive plastic film, in such a way that the Cu foils adhere well to the base material, or pressed with a first and/or with a second Cu sheet, and a first and/or a second self-adhesive plastic film is applied thereto, the holes are produced, these holes are completely filled with a conductive material by spreading on with the a squeegee or by rolling on to the exposed surface of the first self-adhesive plastic film, the self-adhesive plastic films are removed, parts of the conductive material which project beyond the remaining Cu sheets are removed after the curing of said material and, consequently, the surfaces of the Cu sheets are planarized, and the Cu sheets are structured in a customary manner to produce a conductive pattern.

According to a preferred embodiment of the third variant of the invention, the conductive material is already cured before the self-adhesive plastic films are removed.

U.S. Pat. No. 4,383,363 describes a method for the production of printed circuit boards with at least one electrically conductive through-plating which runs in a hole in an insulating base material from a first surface to a second surface, having the following steps:

the holes are produced in the still uncovered base material, the holes are filled with a conductive material in a filling step without masks, the base material is covered with at least one Cu foil, and the Cu sheets are structured to produce a conductive pattern.

U.S. Pat. No. 4,383,363 describes a further method for the production of printed circuit boards with at least one electrically conductive through-plating which runs in a hole in an insulating base material from a first surface to a second surface, having the following steps:

the holes are produced in the base material already covered with at least one Cu foil, the holes are filled with a conductive material in a filling step without masks, and the Cu sheets are structured to produce a conductive pattern.

Therefore, U.S. Pat. No. 3,383,363 describes only the filling of holes of printed circuit boards with a conductive material.

According to preferred improvements of the three variants of the invention, an additional conductive layer is applied to the Cu sheets and the through-platings, which are closed off in a planar manner, before the Cu sheets are structured to produce a conductive pattern.

The basic concept of the invention consists in first providing a double layer to be removed again in the course of the method, then closing off the holes by completely filling them with a suitable material (filling or conductive material), then removing the double layer together with portions of this material and then removing cured stubs of the filling or conductive material, which stubs consists of a unique material and do only project beyond the holes, and thereby rendering the surfaces of the printed circuit board planar.

A significant advantage of the invention is that it produces completely filled holes in a more simple manner then it is described by the afore-mentioned prior art. Therefore, the usual structuring for producing a desired layout is possible as with a circuit board being planar per se. Furthermore, no crack formations are to be expected.

A further advantage of the invention is that, with respect to the first and second variant, the Cu layers of all holes have substantially the same thickness.

BRIEF DESCRIPTION OF THE DRAWINGS

The invention will now be explained in more detail with reference to the figures of the drawing, in which embodiments of a single through-plating are illustrated perspectively, not to scale and in states such as are produced after individual steps of the methods of the invention. Reference symbols which have been explained with reference to one figure will, for the sake of clarity, only be repeated in the following figures if it is necessary for a direct understanding of this following figure.

DETAILED DESCRIPTION OF THE DRAWINGS

It may be mentioned in advance that a detail of a double-sided printed circuit board which is laminated on both sides and on which the method steps are performed is illustrated in the figures. Of course, the invention can also be employed with printed circuit boards which are laminated only on one side or with multilayer printed circuit boards which have a conductive pattern externally on one side or on two sides.

Figure 1:
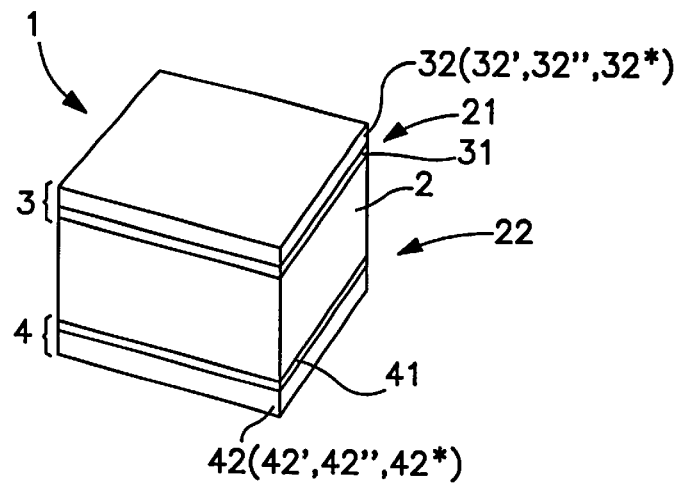
FIG. 1 shows a detail of a coated printed circuit board.

FIG. 1 illustrates a state of a printed circuit board 1 such as is produced after the following method steps: An insulating base material 2 is pressed on a first and on a second surface 21, 22 with a first and with a second two-layered foils 3, 4, respectively.

The foils 3 and 4 comprise a first layer, which is a Cu foil 31 and 41, respectively, and a second layer 32 and 42, respectively, which is a Cu layer 32' and 42', respectively, according to the first variant of the invention or is an acrylonitrile-butadiene-styrene-copolymer film 32" and 42", respectively, according to the second variant of the invention or is a self-adhesive plastic film 32\* and 42\*, respectively, according to the third variant of the invention.

The first and the second two-layered foils 3 and 4, respectively, are pressed with the base material in such a way that the Cu foil 31 and 41, respectively, adheres well to the base material, in the way that this is necessary and customary for Cu-laminated printed circuit boards.

Figure 2:
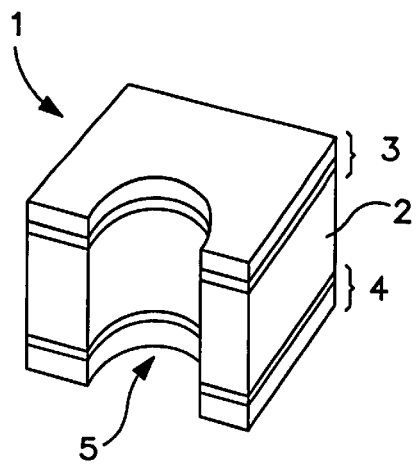
FIG. 2 shows the coated printed circuit board of FIG. 1 with a hole made therein and illustrated in section.

FIG. 2 shows the coated printed circuit board of FIG. 1 with a hole 5 made therein and illustrated in section. The hole passes completely through the base material 2 and the two two-layered foils 3, 4.

Figure 3:
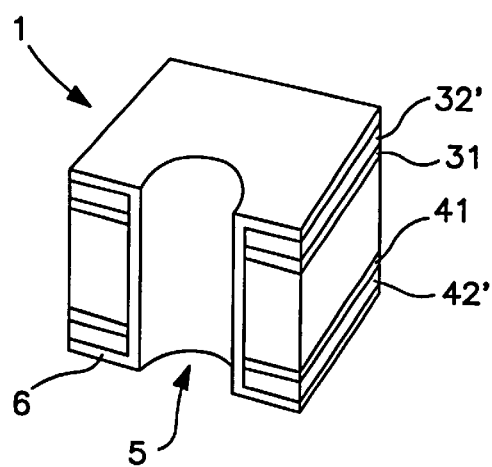
FIG. 3 shows the printed circuit board, provided with a hole, of FIG. 2 with a metallization layer applied to Cu layers and in the hole.

FIG. 3 shows the state after the printed circuit board 1, provided with a hole, of FIG. 2, including the hole 5 according to the first variant of the invention, has been metallized with Cu, for example by wet-chemical electro-plating or wet-chemical electroless metallization. The wall of the hole 5 and the outer sides of the Cu layers 32', 42' are then provided with a continuous third Cu layer 6.

Figure 4:
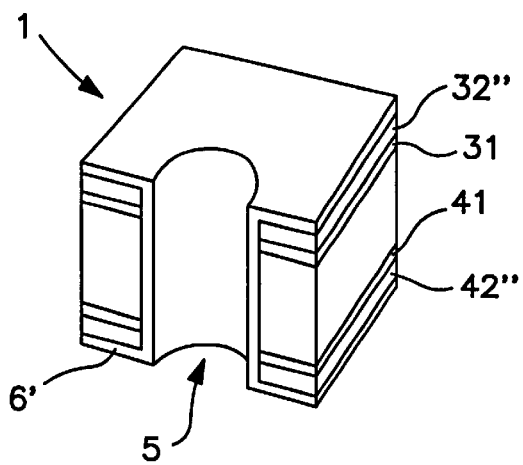
FIG. 4 shows the printed circuit board, provided with a hole, of FIG. 2 with a metallization layer applied to acrylonitrile-butadiene-styrene-copolymer films and in the hole.

FIG. 4 shows the state after the printed circuit board 1, provided with a hole, of FIG. 2, including the hole 5 according to the second variant of the invention, has been metallized with Cu, for example by wet-chemical electro-plating or wet-chemical electroless metallization. The wall of the hole 5 and the outer sides of the acrylonitrile-butadiene-styrene-copolymer films 32", and 42", respectively, are then provided with a continuous first Cu layer 6'.

Figure 5:
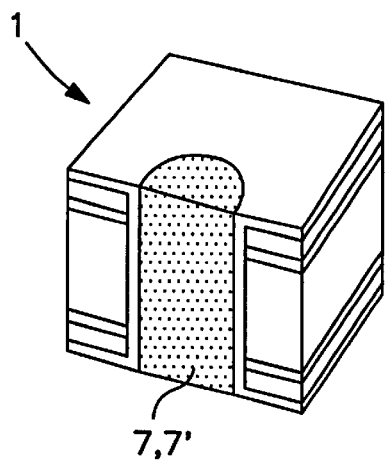
FIG. 5 shows the printed circuit board of FIG. 3 with an insulating material or conductive material introduced into the hole.

FIG. 5 shows the state after the printed circuit board 1 of FIG. 3 or that of FIG. 4, together with the metallized hole 5, has been completely filled with an insulating material 7 or with a conductive material 7' in a filling step without masks. This filling is carried out by spreading on, similar to screen printing, with the abovementioned squeegee or by rolling on. All of the holes produced in an actual printed circuit board are completely filled with the insulating material 7 or the conductive material 7' by means of this step.

Figure 6:
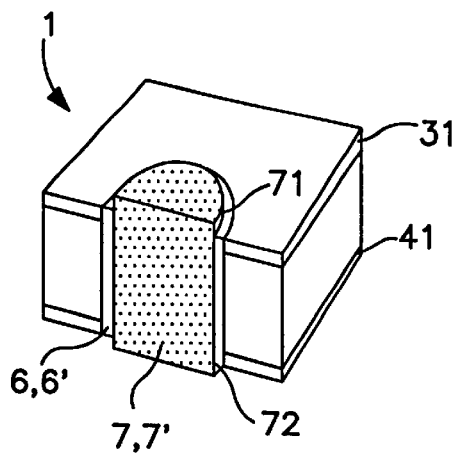
FIG. 6 shows the printed circuit board of FIG. 5 after the removal of the Cu layers or acrylonitrile-butadiene-styrene-copolymer films.

FIG. 6 shows the state of the printed circuit board 1 of FIG. 5 after the Cu layers 32', 42', together with those parts of the conductive layer 6 situated thereon, cf. FIG. 3, or the acrylonitrile-butadiene-styrene-copolymer films 32", 42", cf. FIG. 4, have been removed, for example by peeling.

On the surfaces of the printed circuit board 1 which are now exposed there remain only the Cu foils 31, 41, that part of the conductive layer 6, 6' which lies in the hole and the conductive layer 7 or the insulating material 7'. The latter projects beyond the surfaces of the Cu foils in the form of stubs 71, 72.

Figure 7:
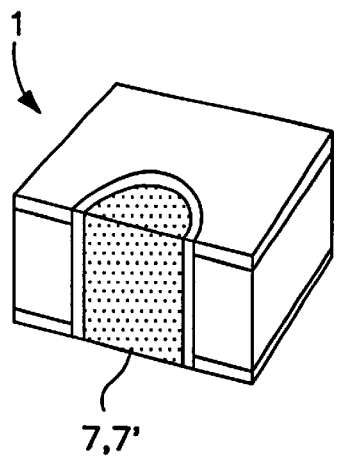
FIG. 7 shows the printed circuit board of FIG. 6 after the removal of stubs of the insulating material.

FIG. 7 shows the state of the printed circuit board 1 of FIG. 6 after the stubs 71, 72 of the insulating material 7 or the conductive material 7' have been removed after their curing and, consequently, the surfaces of the Cu foils have been planarized. This is preferably done by brushing. The Cu foils 31, 41 can then be structured in a customary manner to produce a conductive pattern.

Instead of already removing the metallizable material layers 32', 42' together with those parts of the conductive layer 6 situated thereon or the acrylo-nitrile-butadiene-styrene-copolymer films 32", 42" prior to the curing of the insulating material 7 or the conductive material 7', it may also be advantageous firstly to cure the insulating material or the conductive material after it has been introduced into the holes, and only afterward to remove the Cu layers 32', 42' together with those parts of the conductive layer 6 situated thereon or the acrylonitrile-butadiene-styrene-copolymer films 32", 42" together with those parts of the conductive layer 6' situated thereon.

In the third variant of the invention, which is now to be explained, a state corresponding to FIG. 2 is again taken as a departure point. However, the Cu foil 31 or 41 is in this case coated with a self-adhesive plastic film 32* and 2*, respectively.

Figure 8:
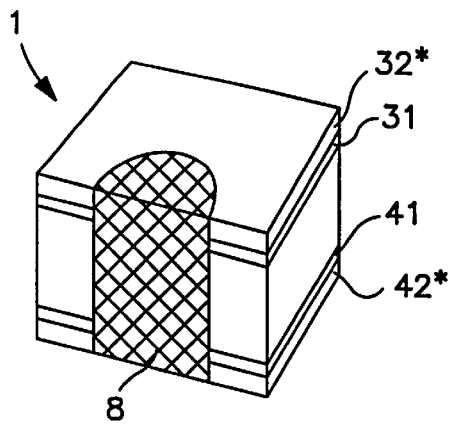
FIG. 8 shows the printed circuit board, provided with a hole, of FIG. 2 with conductive material introduced therein.

FIG. 8 shows the state after the printed circuit board 1 of FIG. 2 has been completely filled with a conductive material 8 in a filling step without masks. This filling has again be carried out by spreading on, similar to screen printing, with the abovementioned squeegee or by rolling on. All of the holes produced in an actual printed circuit board are completely filled with the conductive material 8 by means of this step.

Figure 9:
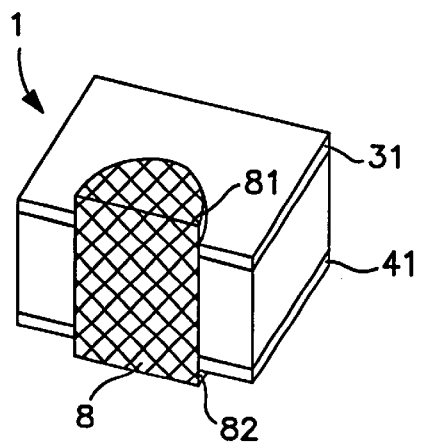
FIG. 9 shows the printed circuit board of FIG. 8 after the removal of the self-adhesive plastic film.

FIG. 9 shows the state of the printed circuit board 1 of FIG. 8 after the self-adhesive plastic films 32*, 42* have been removed, for example by stripping. On the surfaces of the printed circuit board 1 which are now exposed there remain only the Cu foils 21, 22 and the conductive material 8. The latter projects beyond the surfaces of the Cu foils in the form of stubs 81, 82.

Figure 10:
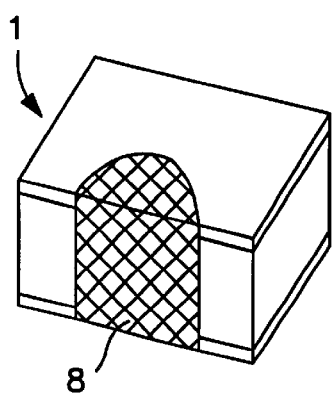
FIG. 10 shows the printed circuit board of FIG. 9 after the removal of stubs of the conductive material.

FIG. 10 shows the state of the printed circuit board 21 of FIG. 9 after the stubs 81, 82 of the conductive material 8 have been removed after their curing and, consequently, the surfaces of the Cu foils have been planarized. This is again preferably done by brushing. The Cu foils 31, 41 can then be structured in a customery manner to produce a conductive pattern.

Instead of already removing the self-adhesive plastic films 32*, 42* prior to the curing of the conductive material 8, it may also be advantageous firstly to cure the conductive material after it has been introduced into the holes and only afterwards to remove the self-adhesive plastic films 32*, 42*.

Figure 11:
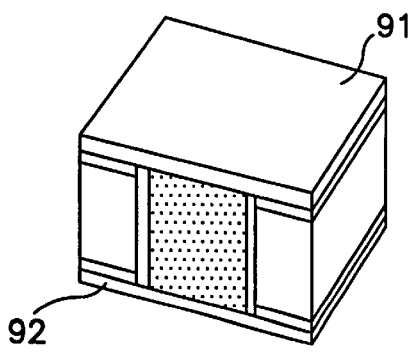
FIG. 11 shows the printed circuit board of FIG. 7 after the application of an additional conductive layer.
Figure 12:
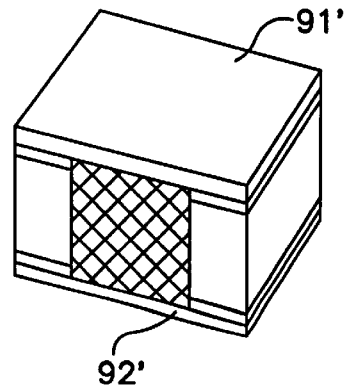
FIG. 12 shows the printed circuit board of FIG. 10 after the application of an additional conductive layer.

FIGS. 11 and 12 show an improvement of the three variants of the invention. Thus, in FIG. 11 the printed circuit board of FIG. 7 has also been provided with additional conductive layers 91 and 92, which can then be structured in a customary manner to produce a conductive pattern.

In FIG. 12, the printed circuit board of FIG. 10 has also been provided with additional conductive layers 91' and 92', which can then be structured in a customary manner to produce a conductive pattern.

Instead of using the two-layered foils 3, 4 it is also possible firstly to press the base material with a Cu foil and to apply a Cu layer to an exposed surface of this—single-layered—Cu foil according to the first variant of the invention, or to apply a acrylonitrile-butadiene-styrene-copolymer film to said surface according to the second variant of the invention, or to apply a self-adhesive plastic film to said surface according to the third variant of the invention.

The following materials are preferably used in the invention:
- as base material: customary FR 4 (FR=flame retarding);
- as insulating material: commercially available epoxy resins with a high solids content;
- as conductive material: commercially available Ag- or Cu-containing conductive adhesive, of the kind used, for example, for fixing the above-mentioned SMD components on printed circuit boards;
- as additional conductive layer: Cu.

What is claimed is:

1. A method for the production of a printed circuit board with at least one electrically conductive through-plating running through at least one hole in an insulating base material, the at least one hole defining walls running from a first surface of the base material to a second surface of the base material, the method comprising the steps of:

adhering to the first surface of the base material a first two-layered foil comprising a first conductive foil covered with a first material layer;

creating the at least one hole through the first two-layered foil and the base material;

forming, after the hole creating step, a first conductive layer upon the first two-layered foil and upon the walls of the at least one hole in order to obtain at least one metalized hole;

filling the at least one metalized hole completely with a fill material to obtain at least one filled hole;

removing the first material layer and the first conductive layer from the first conductive foil adhered to the first surface of the base material after the step of filling the at least one metalized hole;

curing the fill material in the at least one metalized hole;

planarizing, after the curing step, a first conductive surface defined by the first conductive foil and the fill material by removing portions of the fill material which protrude beyond the first conductive foil; and producing a first conductive pattern upon the first conductive foil after the first conductive surface planarizing step.

2. The method of claim 1, wherein the curing step occurs before the first material layer removing step.

3. The method of claim 2, further comprising the step of:
forming a second conductive layer upon the first conductive foil and the at least one filled hole before the first conductive pattern producing step.

4. The method of claim 1, further comprising the step of:
forming a second conductive layer upon the first conductive foil and the at least one filled hole before the first conductive pattern producing step.

5. The method of claim 1, wherein:
the first material layer comprises at least one of a first copper layer and a metalizable acrylonitrile-butadiene-styrene-copolymer film.

6. The method of claim 1, wherein:
the fill material comprises at least one of an insulating material and a conductive material.

7. The method of claim 1, further comprising the steps of:
adhering to the second surface of the base material a second two-layered foil comprising a second conductive foil covered with a second material layer;
removing the second material layer and the first conductive layer from the second conductive foil adhered to the second surface of the base material;
planarizing, after the curing step, a second conductive surface defined by the second conductive foil and the fill material by removing portions of the fill material which protrude beyond the second conductive foil;
producing a second conductive pattern upon the second conductive foil after the second conductive surface planarizing step, wherein
the hole creating step includes the step of creating the at least one hole through the second two-layered foil, and
the forming step includes the step of forming the first conductive layer upon the second two-layered foil.

8. The method of claim 7, wherein the curing step occurs before the first material layer removing step and the second material layer removing step.

9. The method of claim 8, further comprising the step of:
forming a second conductive layer upon the first conductive foil, the second conductive foil, and the at least one filled hole before the first conductive pattern producing step and the second conductive pattern producing step.

10. The method of claim 7, further comprising the step of:
forming a second conductive layer upon the first conductive foil, the second conductive foil, and the at least one filled hole before the first conductive pattern producing step and the second conductive pattern producing step.

11. The method of claim 7, wherein:
the first material layer comprises at least one of a first copper layer and a first metalizable acrylonitrile-butadiene-styrene-copolymer film, and
the second material layer comprises at least one of a second copper layer and a second metalizable acrylonitrile-butadiene-styrene-copolymer film.

12. The method of claim 7, wherein:
the fill material comprises at least one of an insulating material and a conductive material.

13. A method for the production of a printed circuit board with at least one electrically conductive through-plating running through at least one hole in an insulating base material, the at least one hole defining walls running from a first surface of the base material to a second surface of the base material, the method comprising the steps of:
adhering a first conductive foil to the first surface of the base material;
applying a first material layer to the first conductive foil after the first conductive foil adhering step;
creating the at least one hole through the first material layer, the first conductive foil, and the base material;
forming, after the hole creating step, a first conductive layer upon the first material layer and upon the walls of the at least one hole in order to obtain at least one metalized hole;
filling the at least one metalized hole completely with a fill material to obtain at least one filled hole;
removing the first material layer and the first conductive layer from the first conductive foil adhered to the first surface of the base material after the step of filling the at least one metalized hole;
curing the fill material in the at least one metalized hole;
planarizing, after the curing step, a first conductive surface defined by the first conductive foil and the fill material by removing portions of the fill material which protrude beyond the first conductive foil; and
producing a first conductive pattern upon the first conductive foil after the first conductive surface planarizing step.

14. The method of claim 13, wherein the curing step occurs before the first material layer removing step.

15. The method of claim 14, further comprising the step of:
forming a second conductive layer upon the first conductive foil and the at least one filled hole before the first conductive pattern producing step.

16. The method of claim 13, further comprising the step of:
forming a second conductive layer upon the first conductive foil and the at least one filled hole before the first conductive pattern producing step.

17. The method of claim 13, wherein:
the first material layer comprises at least one of a first copper layer and a metalizable acrylonitrile-butadiene-styrene-copolymer film.

18. The method of claim 13, wherein:
the fill material comprises at least one of an insulating material and a conductive material.

19. The method of claim 13, further comprising the steps of:
adhering a second conductive foil to the second surface of the base material;
applying a second material layer to the second conductive foil after the second conductive foil adhering step;
removing the second material layer and the first conductive layer from the second conductive foil adhered to the second surface of the base material;
planarizing, after the curing step, a second conductive surface defined by the second conductive foil and the fill material by removing portions of the fill material which protrude beyond the second conductive foil; and
producing a second conductive pattern upon the second conductive foil after the second conductive surface planarizing step, wherein
the hole creating step includes the step of creating the at least one hole through the second conductive foil and the second material layer, and
the forming step includes the step of forming the first conductive layer upon the second material layer.

20. The method of claim 19, wherein the curing step occurs before the first material layer removing step and the second material layer removing step.

21. The method of claim 20, further comprising the step of:
forming a second conductive layer upon the first conductive foil, the second conductive foil, and the at least one filled hole before the first conductive pattern producing step and the second conductive pattern producing step.

22. The method of claim 19, further comprising the step of:
forming a second conductive layer upon the first conductive foil, the second conductive foil, and the at least on filled hole before the first conductive pattern producing step and the second conductive pattern producing step.

23. The method of claim 19, wherein:
the first material layer comprises at least one of a first copper layer and a first metalizable acrylonitrile-butadiene-styrene-copolymer film, and
the second material layer comprises at least one of a second copper layer and a second metalizable acrylonitrile-butadiene-styrene-copolymer film.

24. The method of claim 19, wherein:
the fill material comprises at least one of an insulating material and a conductive material.

25. A method for the production of a printed circuit board with at least one electrically conductive through-plating running through at least one hole in an insulating base material, the at least one hole running from a first surface of the base material to a second surface of the base material, the method comprising the steps of:
adhering to the first surface of the base material a first two-layered foil comprising a first conductive foil covered with a first self-adhesive film;
creating the at least one hole through the first two-layered foil and the base material;
filling the at least one hole completely with a conductive fill material to obtain at least one filled hole;
removing the first self-adhesive film from the first conductive foil adhered to the first surface of the base material after the step of filling the at least one hole;
curing the conductive fill material in the at least one hole;
planarizing, after the curing step, a first conductive surface defined by the first conductive foil and the conductive fill material by removing portions of the conductive fill material which protrude beyond the first conductive foil; and
producing a first conductive pattern upon the first conductive foil after the first conductive surface planarizing step.

26. The method of claim 23, wherein the curing step occurs before the first self-adhesive film removing step.

27. The method of claim 26, further comprising the step of:
forming a conductive layer upon the first conductive foil and the at least one filled hole before the first conductive pattern producing step.

28. The method of claim 25, further comprising the step of:
forming a conductive layer upon the first conductive foil and the at least one filled hole before the first conductive pattern producing step.

29. The method of claim 25, further comprising the steps of:
adhering to the second surface of the base material a second two-layered foil comprising a second conductive foil covered with a second self-adhesive film;
removing the second self-adhesive film from the second conductive foil adhered to the second surface of the base material;
planarizing, after the curing step, a second conductive surface defined by the second conductive foil and the conductive fill material by removing portions of the conductive fill material which protrude beyond the second conductive foil;
producing a second conductive pattern upon the second conductive foil after the second conductive surface planarizing step, wherein
the hole creating step includes the step of creating the at least one hole through the second two-layered foil.

30. The method of claim 29, wherein the curing step occurs before the first self-adhesive film removing step and the second self-adhesive film removing step.

31. The method of claim 30, further comprising the step of:
forming a conductive layer upon the first conductive foil, the second conductive foil, and the at least one filled hole before the first conductive pattern producing step and the second conductive pattern producing step.

32. The method of claim 29, further comprising the step of:
forming a conductive layer upon the first conductive foil, the second conductive foil, and the at least one filled hole before the first conductive pattern producing step and the second conductive pattern producing step.

33. A method for the production of a printed circuit board with at least one electrically conductive through-plating running through at least one hole in an insulating base material, the at least one hole running from a first surface of the base material to a second surface of the base material, the method comprising the steps of:
adhering a first conductive foil to the first surface of the base material;
applying a first self-adhesive film to the first conductive foil after the first conductive foil adhering step;
creating the at least one hole through the first conductive foil, the first self-adhesive film, and the base material;
filling the at least one hole completely with a conductive fill material to obtain at least one filled hole;
removing the first self-adhesive film from the first conductive foil adhered to the first surface of the base material after the step of filling the at least one hole;
curing the conductive fill material in the at least one hole;
planarizing, after the curing step, a first conductive surface defined by the first conductive foil and the conductive fill material by removing portions of the conductive fill material which protrude beyond the first conductive foil; and
producing a first conductive pattern upon the first conductive foil after the first conductive surface planarizing step.

34. The method of claim 32, wherein the curing step occurs before the first self-adhesive film removing step.

35. The method of claim 34, further comprising the step of:
forming a conductive layer upon the first conductive foil and the at least one filled hole before the first conductive pattern producing step.

36. The method of claim 32, further comprising the step of:
forming a conductive layer upon the first conductive foil and the at least one filled hole before the first conductive pattern producing step.

37. The method of claim 33, further comprising the steps of:
adhering a second conductive foil to the second surface of the base material;
applying a second self-adhesive film to the second conductive foil after the second conductive foil adhering step;
removing the second self-adhesive film from the second conductive foil adhered to the second surface of the base material;
planarizing, after the curing step, a second conductive surface defined by the second conductive foil and the conductive fill material by removing portions of the conductive fill material which protrude beyond the second conductive foil; and
producing a second conductive pattern upon the second conductive foil after the second conductive surface planarizing step, wherein
the hole creating step includes the step of creating the at least one hole through the second conductive foil and the second self-adhesive film.

38. The method of claim 37, wherein the curing step occurs before the first self-adhesive film removing step and the second self-adhesive film removing step.

39. The method of claim 38, further comprising the step of:
forming a conductive layer upon the first conductive foil, the second conductive foil, and the at least one filled hole before the first conductive pattern producing step and the second conductive pattern producing step.

40. The method of claim 37, further comprising the step of:
forming a conductive layer upon the first conductive foil, the second conductive foil, and the at least one filled hole before the first conductive pattern producing step and the second conductive pattern producing step.

* * * * *

UNITED STATES PATENT AND TRADEMARK OFFICE
CERTIFICATE OF CORRECTION

PATENT NO.    : 6,272,745 B1                                             Page 1 of 1
DATED         : August 14, 2001
INVENTOR(S)   : Peter Kersten It is certified that error appears in the above-identified patent and that said Letters Patent is hereby corrected as shown below:

Title page,
Item [56], the following Cited References should be included:

-- U.S. PATENT DOCUMENTS

| | | |
|---|---|---|
| 3,601,523 | 8/1971 | Lloyd G. Arndt |
| 4,283,243 | 8/1981 | Andraedes et al. |
| 3,640,789 | 2/1972 | Hepfer |
| RE.29284 | 6/1977 | Shaheen et al. |

FOREIGN PATENT DOCUMENTS

| | | |
|---|---|---|
| 5-167260 | 7/1963 | Japan |
| 5-175653 | 12/1991 | Japan -- |

Signed and Sealed this

Twenty-ninth Day of April, 2003

JAMES E. ROGAN
*Director of the United States Patent and Trademark Office*